United States Patent [19]

Misumi et al.

[11] Patent Number: 5,026,978
[45] Date of Patent: Jun. 25, 1991

[54] PHOTOELECTRIC SWITCH HAVING PULSE DRIVER CIRCUITRY

[75] Inventors: Fumihiko Misumi, Ibaraki; Masazumi Ueda; Masato Hara, both of Kyoto; Yutaka Matsui, Mukou; Kiyoshi Imai, Kyoto, all of Japan

[73] Assignee: Omron Corporation, Kyoto, Japan

[21] Appl. No.: 468,091

[22] Filed: Jan. 22, 1990

[30] Foreign Application Priority Data

Jan. 25, 1989 [JP] Japan .................................. 1-15772
Feb. 1, 1989 [JP] Japan .................................. 1-24660

[51] Int. Cl.$^5$ .............................................. G01J 1/32
[52] U.S. Cl. .................................... 250/205; 356/141; 455/618; 455/613
[58] Field of Search ................. 250/205; 455/607, 608, 455/611, 613, 618; 356/141, 152

[56] References Cited

U.S. PATENT DOCUMENTS

| 4,621,376 | 11/1986 | Namamura et al. | 455/618 |
| 4,733,398 | 3/1988 | Shibagaki et al. | 250/205 |
| 4,916,689 | 4/1990 | Bielinski | 455/608 |

Primary Examiner—David C. Nelms
Assistant Examiner—Que T. Le
Attorney, Agent, or Firm—Dickstein, Shapiro & Morin

[57] ABSTRACT

A light projecting circuit of a photoelectric switch includes a light projecting element (2), a driver circuit (1, 3) for driving the light projecting element by use of pulses, and a change-over switch (4) for increasing or for decreasing an amount of light emitted from the light projecting element. With this provision, in an operation to adjust optical axes, the change-over switch can be used to increase the amount of the emitted light. Consequently, the position of the projected light beam can be easily confirmed.

17 Claims, 11 Drawing Sheets

PHOTOELECTRIC SWITCH HAVING PULSE DRIVER CIRCUITRY

BACKGROUND OF THE INVENTION

1. Field of the Invention

The present invention relates to a photoelectric switch, and in particular, to a photoelectric switch including a light projecting circuit which can be changed over to increase an amount of projected light in occasions such as in adjustment of an optical axis and further to a photoelectric switch associated with optical fibers in which a projected light is introduced to a sense position by means of an optical fiber and a transmitted light or a reflection light thereof is delivered from the sense position to a light receiving element by use of an optical fiber.

2. Description of the Prior Art

Heretofore, in a light projecting circuit of an photoelectric switch, a light-emitting diode (LED) is used as a light projecting element. The LED is connected to a resistor for limiting a current flowing therethrough and a transistor as a driver thereof. The transistor has a base, which is supplied with a pulse signal from an oscillator so as to be turned on and off in response thereto, thereby resultantly blinking the LED by use of the pulse signal. As shown in FIG. 8, the photoelectric switch of this type can be used in a wide range of environmental temperatures T ranging from $-25°$ C. to $55°$ C. The LED is assigned with a rated current $I_B$, which is decreased as the temperature T is increased. In consequence, the driving current of the light projecting LED has a limit associated with a rated current developed at an upper limit of the environmental temperature ($I_A$ of FIG. 8).

In the conventional photoelectric switch, the rated current obtained at the upper limit of the environmental temperature limits the light projecting current. Consequently, the amount of the light thus projected from the LED is not sufficient. Even when a red-light LED is employed, a position of a beam of lights is not easily determined and hence there has been a problem that a considerably long period of time is necessary to align a light axis, for example, in a light receiving section.

On the other hand, in a photoelectric switch employing optical fibers in which the fibers connect a sense position to a sensor unit, for example, as shown in FIG. 14, a light projecting element 6 of a sensor unit 101 is intermittently driven (with pulsated signals or pulses) by means of an oscillator circuit 103 so as to deliver a light emitting output from the light emitting element 6 to a light projecting optical fiber 7. Disposed to oppose an end surface of the optical fiber 7 is an end surface a light receiving optical fiber 8. Through the optical fiber 8, a light signal is delivered so as to be sensed by a light receiving element 9, which converts the light signal into an electric signal to be processed through an amplifier circuit 106, a detection circuit 107, and a waveform shaping circuit 108. The electric signal is thus converted into a rectangular wave to be outputted as an object sense signal via an output circuit 109 and to an indicator lamp 110, which thus indicates a sense state of an object. In the conventional photoelectric switch using optical fibers, since the optical fiber has a small diameter and is flexible, such a photoelectric switch is arranged in a position where the ordinary photoelectric switch not employing the optical fiber cannot be easily installed. In this arrangement, the optical fibers 7 and 8 are extended from the sensor unit 101. With the provision of this configuration in which an optical system of the photoelectric switch is constituted with optical fibers having a small diameter, it is possible to sense a fine or very small object.

However, in the photoelectric switch adopting the optical fibers as described above, since the end portions of the optical fibers 7 and 8 are separated from the sensor unit, in an alignment of optical axes of the optical fibers and in a position alignment to adjust a distance to an object, it is necessary to confirm the blinking state of the indicator lamp 110 of the sensor unit 101 disposed at a location separated from the end portions of the optical fibers 7 and 8. Consequently, when the sensing position (associated with the end positions of the optical fibers) is apart from a location of the sensor unit or when a fine adjustment is required in the setting of the apparatus, there has been a disadvantage that the adjustment takes a long period of time.

SUMMARY OF THE INVENTION

It is therefore an object the present invention to provide a photoelectric switch in which an amount of light is increased when adjusting an optical axis to facilitate an alignment of a beam position.

A technical problem to be solved in accordance with the present invention devised to cope with the problems of the conventional photoelectric switch employing optical fibers is to confirm an operation state at end portions of the optical fibers.

In accordance with the present invention, a light projecting circuit of a photoelectric switch includes a light projecting element, a driver circuit to drive the light projecting element by use of pulses, and switch or change-over means for increasing or for decreasing an amount of the light projected from the light projecting element.

A forward current of an LED is generally reduced as shown in the graph of FIG. 8. Assuming the environmental temperature of the LED integrally arranged in the optical switch to be limited to an upper limit $T_A$, the forward current to be developed is required to be at most $I_A$. However, the environmental temperature is set to a usual temperature $T_B$ at which the operator can achieve operations, the forward current flowing through the LED may be set to $I_B$, which is greater than $I_A$.

In the light projecting circuit of the photoelectric switch according to the present invention, when adjusting an optical axis, the system increases, for example, the light projecting current to develop a greater amount of light thus projected. In contrast thereto, when achieving an ordinary operation, the switch means is used to reduce the projected light. In the ordinary operation, the amount of projected light is substantially equal to that of light projected from the light projecting circuit of the conventional photoelectric switch.

In accordance with the present invention, there is provided a photoelectric switch having a light projecting element to emit a visible light therefrom and a light receiving element to receive the emitted light such that the light projecting and receiving elements are respectively provided with a light projecting optical fiber and a light receiving optical fiber at respective end portions thereof so as to sense an object depending on a level of light received by the light receiving element. The photoelectric switch is characterized by including decide means for determining an amount of light obtained from the light receiving optical fiber for each first predetermined period and light project means for changing a number of pulses per a unit period of time from the light projecting element based on the decided amount of light thus determined by the decide means, thereby intermittently driving the light projecting element.

In accordance with the present invention, when aligning optical axes of the optical fibers, the light projecting element is intermittently driven by the light projecting means and then the amount of light attained from the light receiving optical fiber is determined for each first predetermined period by use of the decide means so as to vary the number of light emitting pulses of the light projecting element based on the obtained light amount. In consequence, as the optical axes approach the aligned positions in the optical axis alignment, the intensity of the light beam emitted from an end surface of the light projecting fiber is increased.

The decide means favorably comprises an integrator circuit for integrating the receive signal attained by the light receiving element for each first predetermined period and a comparator circuit for comparing an output from the integrator circuit with a predetermined threshold value. The light projecting circuit includes an oscillator circuit for oscillating a signal at a second predetermined period, a frequency divider circuit for a frequency of the oscillation output from the oscillator circuit, a synchronization circuit for producing a logical product or an ANDed result between an output from the comparator circuit of the decide means and the oscillation output from the oscillator circuit, and a driver circuit for driving the light projecting element based on the logical sum or ORed result obtained between an output from the synchronization circuit and an output from the frequency divider circuit.

The receive signal is integrated for each first predetermined period by use of the integrator circuit such that the comparator circuit produces a comparison output having a signal width associated with the amount of the receive light. By using the resultant signal as a gate signal, when an oscillation signal is supplied to the light projecting element, the number of emitted pulses per the unit time is altered, thereby changing the intensity of the light beam.

The light projector circuit may also be constituted with a voltage/frequency (V/F) converter for converting a voltage representing the light amount determined by the decide means into a low-frequency signal having a frequency corresponding to the voltage and a driver circuit for driving the light projecting element based on an output from the voltage/frequency converter.

The light projector means is provided with a voltage/frequency converter so that based on an amount of the receive light, the intermittent frequency of light at a visible level is changed by use of the voltage/frequency converter.

In accordance with the present invention, as described above, when aligning optical axes at end portions of the optical fibers, the alignment of the optical axes can be checked depending on the amount of light emitted from the light projecting optical fiber or on the frequency of the blinking. Consequently, the indication on the sensor unit need not be confirmed for the purpose above. Namely, the confirmation can be accomplished by the light at the end portion of the optical fiber. As a result, the operation to align the optical axes of the optical fibers is facilitated, which leads to an advantageous effect that the operation can be easily confirmed.

BRIEF DESCRIPTION OF THE DRAWINGS

These and other objects and advantages of the present invention will become apparent by reference to the following description and accompanying drawings wherein.

DESCRIPTION OF THE PREFERRED EMBODIMENTS

Figure 1:
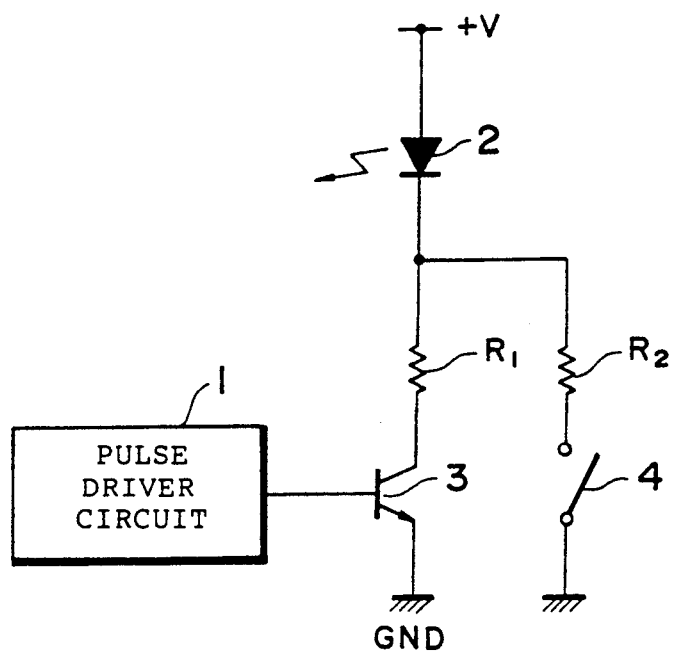
FIG. 1 is a schematic circuit diagram showing a light projecting circuit of a photoelectric switch as a first embodiment in accordance with the present invention.

Referring now to the drawings, description will be given of an embodiment of a photoelectric switch according to the present invention.

Figure 2:
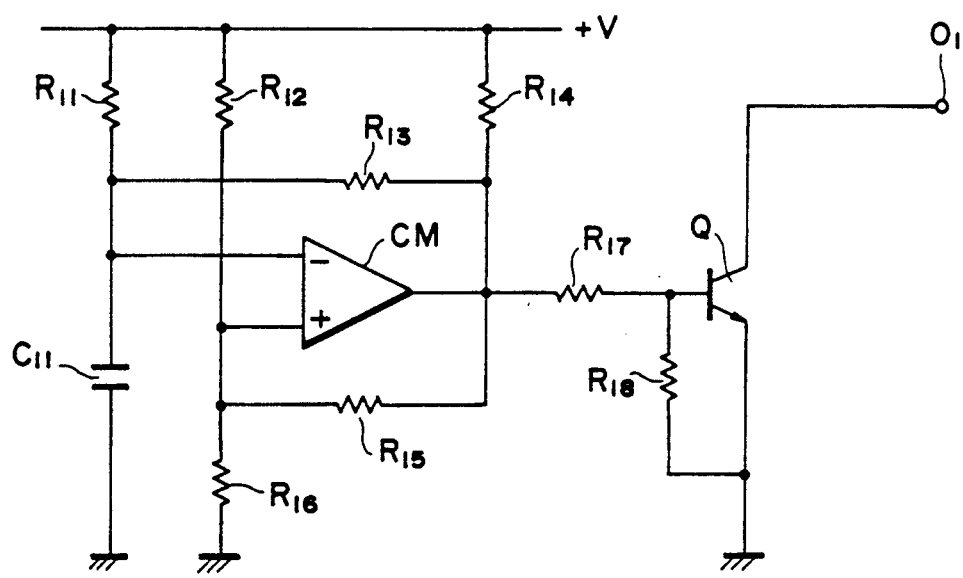
FIG. 2 is a circuit diagram schematically showing a specific example of a pulse driver circuit of the light projecting circuit of the first embodiment.

FIG. 1 is a circuit diagram showing a light projecting circuit of a photoelectric switch as a first embodiment in accordance with the present invention. In this configuration, connected between a power source $+V$ and a ground potential GND are an LED 2 for projecting light, a resistor $R_1$, and a transistor 3. These components are connected in series. The transistor 3 has a base to be supplied with a pulse signal from a pulse driver circuit 1. FIG. 2 shows a concrete circuit example of the pulse driver circuit 1. This circuit structure has been commonly known. Returning to the circuit diagram of FIG. 1, in parallel to a series circuit including the resistor $R_1$ and the transistor 3, there is connected a series circuit constituted with a resistor $R_2$ and a switch 4.

Figure 3:
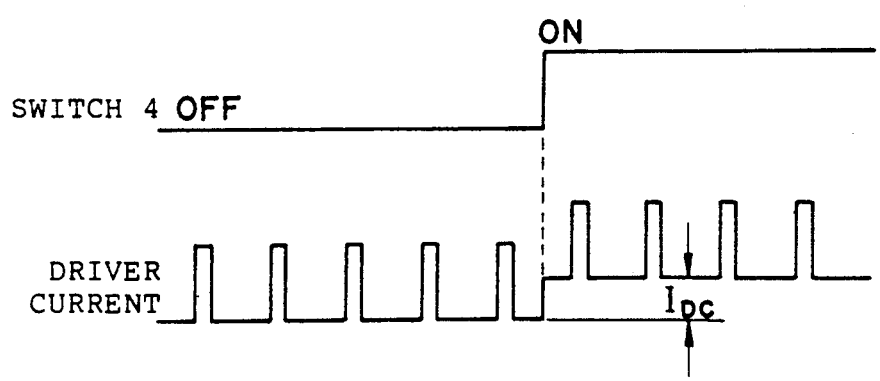
FIG. 3 is a graph showing waveforms useful to explain operations of the light projecting circuit of the first embodiment.

In this circuit constitution, when the switch 4 is set to OFF, the transistor 3 is turned on, as shown in the left portion of the graph of FIG. 3, each time a pulse signal is received from the pulse driver circuit 1. As a result, a drive current flows therethrough so as to turn the LED 2 on. When the switch 4 is set to ON, the resistor $R_2$ is connected in parallel to the series circuit including the resistor $R_1$ and the transistor 3. In consequence, a direct current (dc) $I_{DC}$ flowing through the resistor $R_2$ is additionally applied to the LED 2. Namely, the drive current includes the direct current $I_{DC}$ and the pulse current superimposed thereonto as shown in the right portion of the graph of FIG. 3. As a result, when the switch 4 is turned on, the amount of emitted light develops a maximum value.

In this embodiment, the operations to turn the switch 4 on and off does not influence the alternate current (ac) component of the waveform of the current associated with the projected light. Namely, on the light receiving side, the dc component can be removed by use of a differentiation circuit or the other circuits and hence the sensitivity of the system may be adjusted with the light amount kept increased. In addition, since the interval between light projections is fixed, the response speed is also kept retained, thereby obtaining a condition identical to the actual utilization state.

Figure 4:
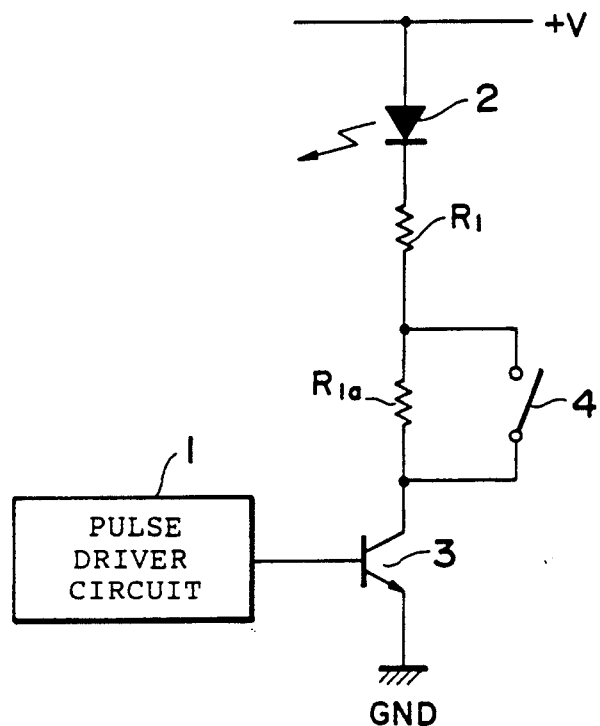
FIG. 4 is a circuit diagram showing a light projecting circuit of a photoelectric switch as a second embodiment in accordance with the present invention.

FIG. 4 is a circuit diagram of a light projecting circuit of a photoelectric switch as a second embodiment in accordance with the present invention. In the light projector circuit of this embodiment, there are connected, between the power supply +V and the ground potential GND a series circuit including an LED 2, resistors $R_1$ and $R_{1a}$, and a transistor 3. The transistor 3 has a base to be supplied with a pulse signal also from a pulse driver circuit 1. The resistor $R_{1a}$ is connected to a switch 4 at both end thereof, which forms a short circuit across the resistor $R_{1a}$. The switch 4 is disposed to change over a magnitude of the pulse driving current.

Figure 5:
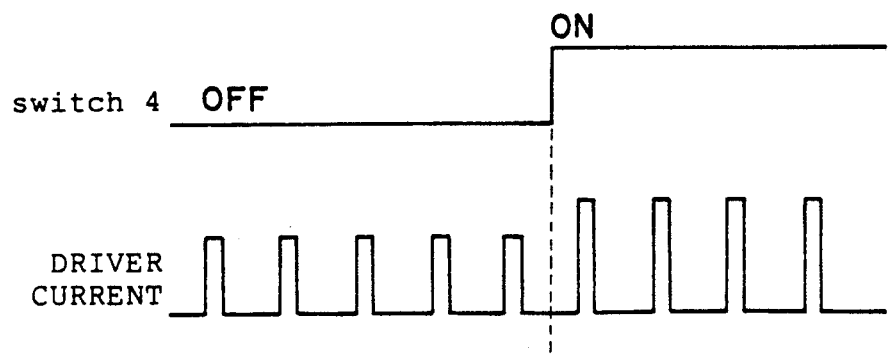
FIG. 5 is a graph showing waveforms useful to explain operations of the light projecting circuit of the second embodiment.

In the circuit configuration of this embodiment, when the switch 4 is turned off, the circuit which flows a drive current to the LED 2 is connected to current limiting resistors $R_1$ and $R_{1a}$. Since these resistors develop a relatively great resistance, the light projecting current is obtained as shown in the waveform on the left-hand side of the graph of FIG. 5, When the switch 4 is set to ON. the resistor $R_{1a}$ is connected to a short circuit thus established and hence the level of the light projecting current flowing through the LED 2 is increased. Namely, the amount of projected light becomes to be greater as compared with that of light projected when the switch 4 is in the off state.

Figure 6:
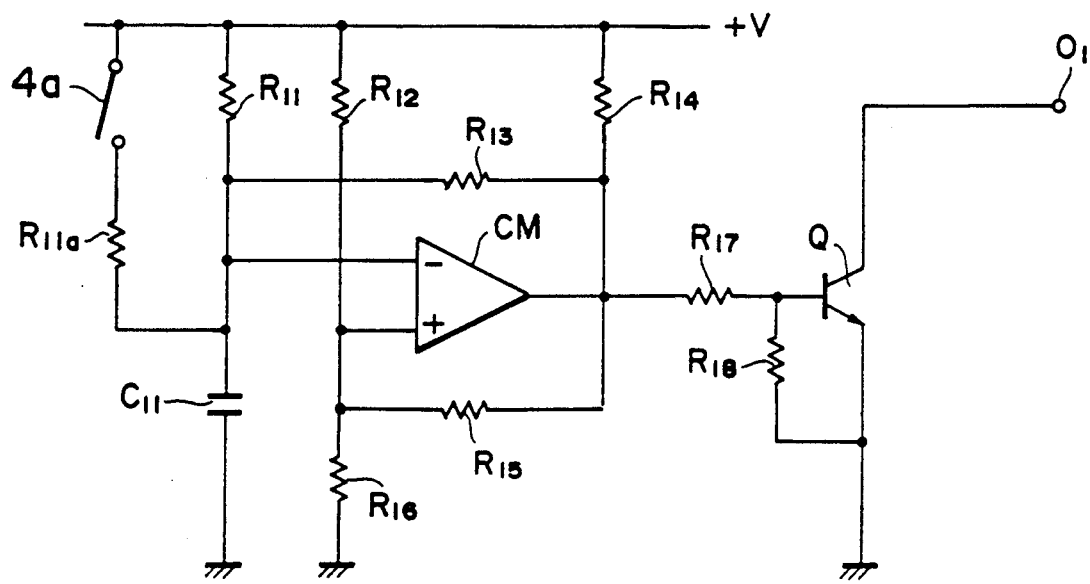
FIG. 6 is a circuit diagram showing a pulse driver circuit of a photoelectric switch as a third embodiment in accordance with the present invention.

FIG. 6 is a circuit diagram showing a pulse driver circuit for a light projecting circuit in a photoelectric switch as a third embodiment in accordance with the present invention. In the general pulse driver circuit shown in FIG. 2, the pulse signal delivered from an output terminal $O_1$ has a pulse width which depends on a value of $C_{11} \times R_{13}$ and a pulse interval which depends on a value of $C_{11} \times R_{11}$, where $C_{11}$ is capacitance of the capacitor $C_{11}$ and $R_{13}$ and $R_{11}$ are resistance values of the resistors $R_{13}$ and $R_{11}$, respectively. Consequently, in the configuration of FIG. 6, a resistor $R_{11a}$ is connected to the resistor $R_{11}$ in parallel so as to configure the circuit system such that the connection of the resistor $R_{11a}$ is established and disconnected by turning a switch $4a$ on and off. Although not shown in this constitution, in the light projecting circuit, there is connected a series circuit including an LED, a resistor, and a transistor between the power source +V and the ground potential GND. The transistor is supplied with a pulse signal delivered from an output terminal $O_1$ of the pulse driver circuit.

Figure 7:
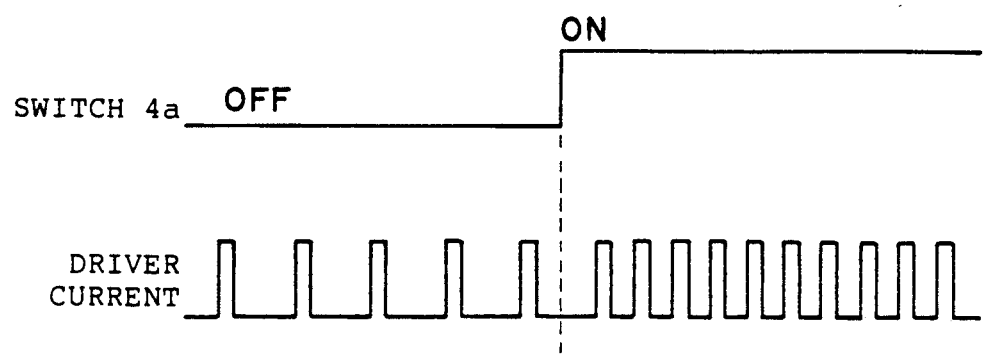
FIG. 7 is a graph showing waveforms useful to explain operations of the third embodiment.
Figure 8:
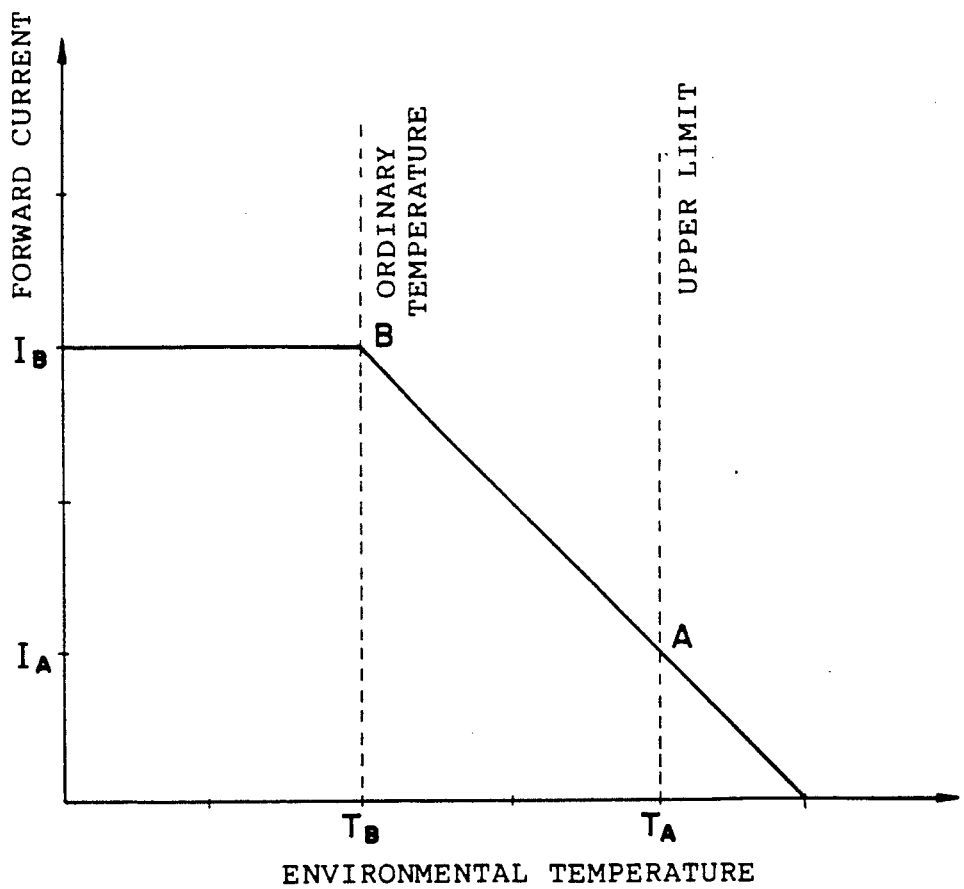
FIG. 8 is a graph showing characteristics developed between environmental temperatures and forward current values developed in an LED.

In this circuit, when the switch $4a$ is set to OFF, the pulse interval is determined by the values of $C_{11}$ and $R_{11}$ as shown in the left-side portion of FIG. 7. When the switch $4a$ is turned on, the resistor $R_{11a}$ is connected to the resistor $R_{11}$ in parallel and hence the pulse interval is represented as $C_{11} \times [R_{11} \cdot R_{11a}/(R_{11}+R_{11a})]$. Namely, the pulse interval is reduced as shown in the right-hand side of FIG. 7. The number of pulses per the unit period of time is increased, which leads to an increase of the amount of emitted light.

Also in this embodiment, like in the first embodiment, the level of the pulse current is kept unchanged regardless of the operations to turn on and off the switch $4a$. In consequence, the sensitivity can be adjusted with the light amount kept increased.

In accordance with the present invention, there is disposed switch means capable of increasing or decreasing the amount of light emitted from the light projecting element. Consequently, in an operation to adjust optical axes, the switch can be operated to project the light of which the amount is greater than that of the light projected in the ordinary operation. As a result, the beam position can be easily confirmed and hence the optical axis adjustment is facilitated.

Figure 9:
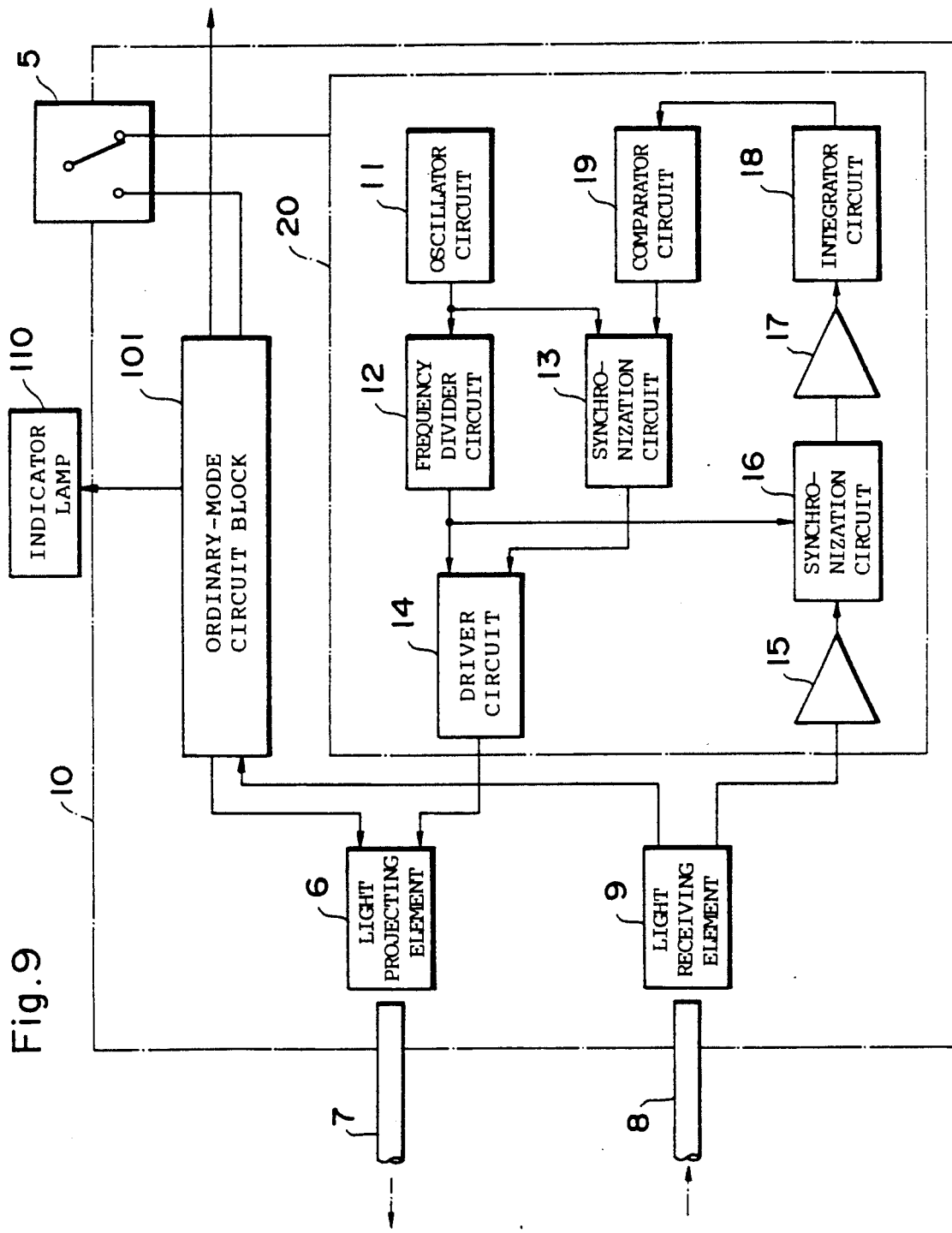
FIG. 9 is a block circuit diagram showing the constitution of the primary portion of a photoelectric switch using optical fibers as a fourth embodiment in accordance with the present invention.

FIG. 9 is a block diagram showing a photoelectric switch employing optical fibers as a fourth embodiment in accordance with the present invention. As can be seen from this configuration, a photoelectric switch 10 employing optical fibers includes a circuit block 101 operative in the ordinary mode to detect presence or absence of an object, an operation indicator lamp 110 to indicate operations thereof, and a circuit block 20 to be operated to align optical axes. The change-over between the ordinary mode and the optical axis alignment mode is accomplished by means of a change-over switch 5 arranged on a panel of the photoelectric switch. Either one of outputs from the circuit blocks 101 and 20 is fed to a light projecting element 6 depending on the state of the change-over switch 5. The light projecting element 6 emits a visible light in response to a signal produced from either one of the circuit blocks 101 and 20. The emitted light is fed to a light projecting optical fiber 7. Like in the case of the conventional example above, an end portion of a light receiving optical fiber 8 is disposed to oppose an end portion of the light projecting optical fiber 7. The light receiving optical fiber 8 is used to conduct the light from a sense region to a photoelectric switch 10. The optical fiber 8 is connected to a light receiving element 9 at other end portion thereof. A light emitted from the light projecting element 6 and obtained from the sense region is received by the light receiving element 9 so as to be converted therein into an electric signal. The light receiving element 9 delivers a resultant signal as an output therefrom to the ordinary-mode block 101 and to the optical axis alignment circuit block 20.

Figure 14:
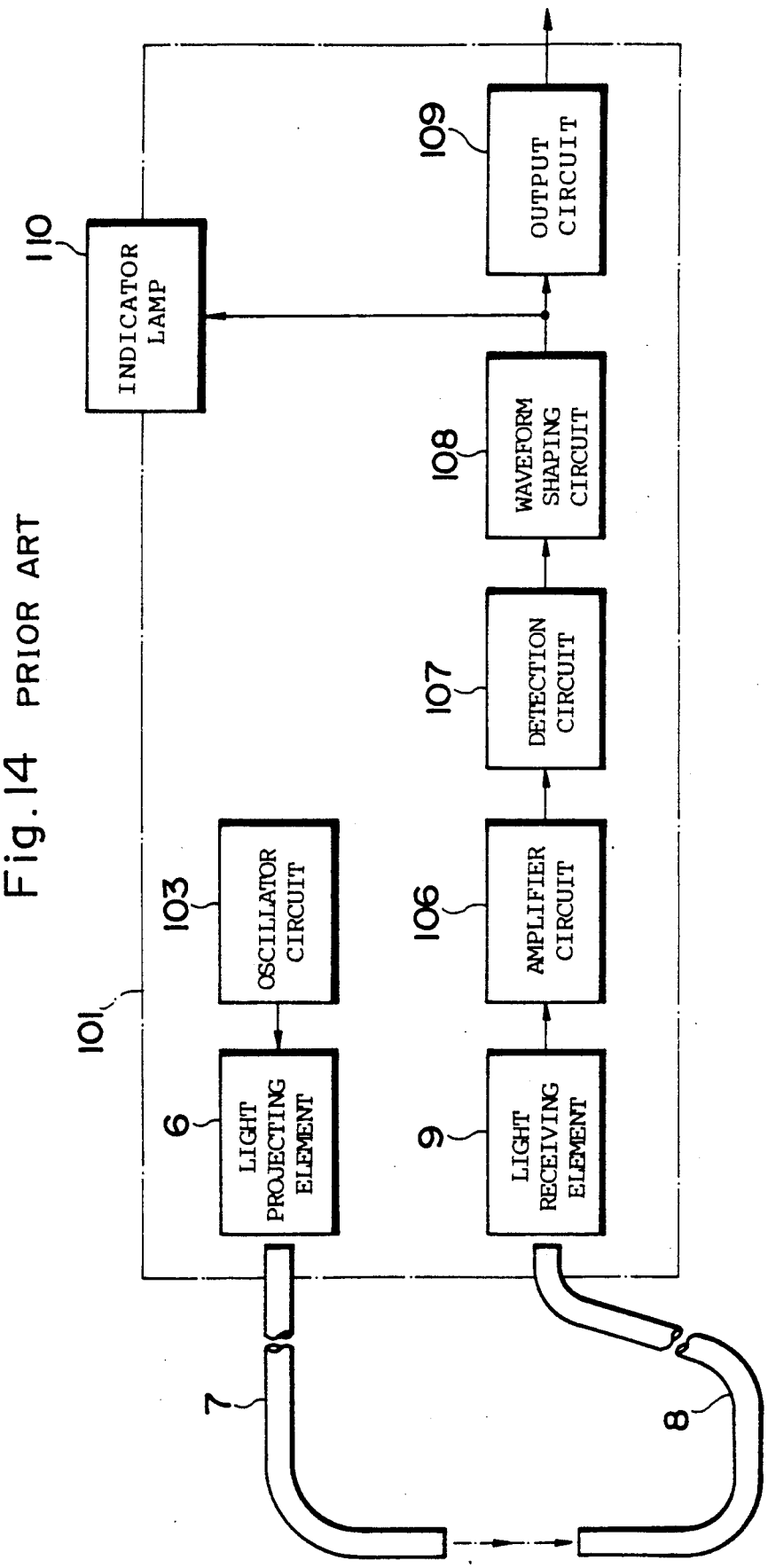
FIG. 14 is a block circuit diagram schematically showing a conventional photoelectric switch using optical fibers.

The configuration of the ordinary-mode circuit block 101 is identical to that of the sensor unit (FIG. 14) of the conventional photoelectric switch employing optical fibers described above. In consequence, the constitution thereof is not shown in FIG. 9, A description will next be given of the optical axis alignment circuit block 20. This circuit block 20 includes an oscillator circuit 11 oscillating at a predetermined period. The oscillator 11 delivers an output to a frequency divider circuit 12 and a synchronization Circuit 13. The frequency divider 12 divides the frequency oscillation output, for example, by four and supplies an output to a driver circuit 14. The light receiving element 9 produces a receive signal, which is then amplified by an amplifier circuit 15 so as to be fed to a synchronization circuit 16. The synchronization circuit 16 is supplied with the frequency divided output from the frequency divider 12 such that the amplified output is further delivered therefrom to an amplifier circuit 17 by using the frequency divided output as a gate signal. The amplifier circuit 17 generates an amplified output, which is supplied via an integrator circuit 18 to a comparator circuit 19. The comparator circuit 19 is provided with a predetermined threshold value Vref1 set thereto so as to supply the synchronization circuit 13 with a signal exceeding the level of the threshold value Vref1. Based on the comparison output as a gate signal, the synchronization circuit 13 creates a synchronization signal based on a logical product between the comparison output and the oscillation output, thereby delivering the resutant signal to the driver circuit 14. The driver circuit 14 produces a drive signal based on a logical sum obtained between the output from the frequency divider circuit 12 and the output from the synchronization circuit 13 so as to drive the light projecting element 6. Incidentally, the amplifier circuit 15, the synchronization circuit 16, the amplifier circuit 17, the integrator circuit 18, and the comparator circuit 19 constitute decide means for determining an amount of light received by the light receiving optical fiber 8 for each predetermined period. On the other hand, the oscillator circuit 12, the frequency divider circuit 12, the synchronization circuit 13, and the driver circuit 14 configure light project means for intermittently driving the light projecting element 6 by chaging the number of pulses emitted therefrom for each unit period of time based on the determined light amount.

Figure 10:
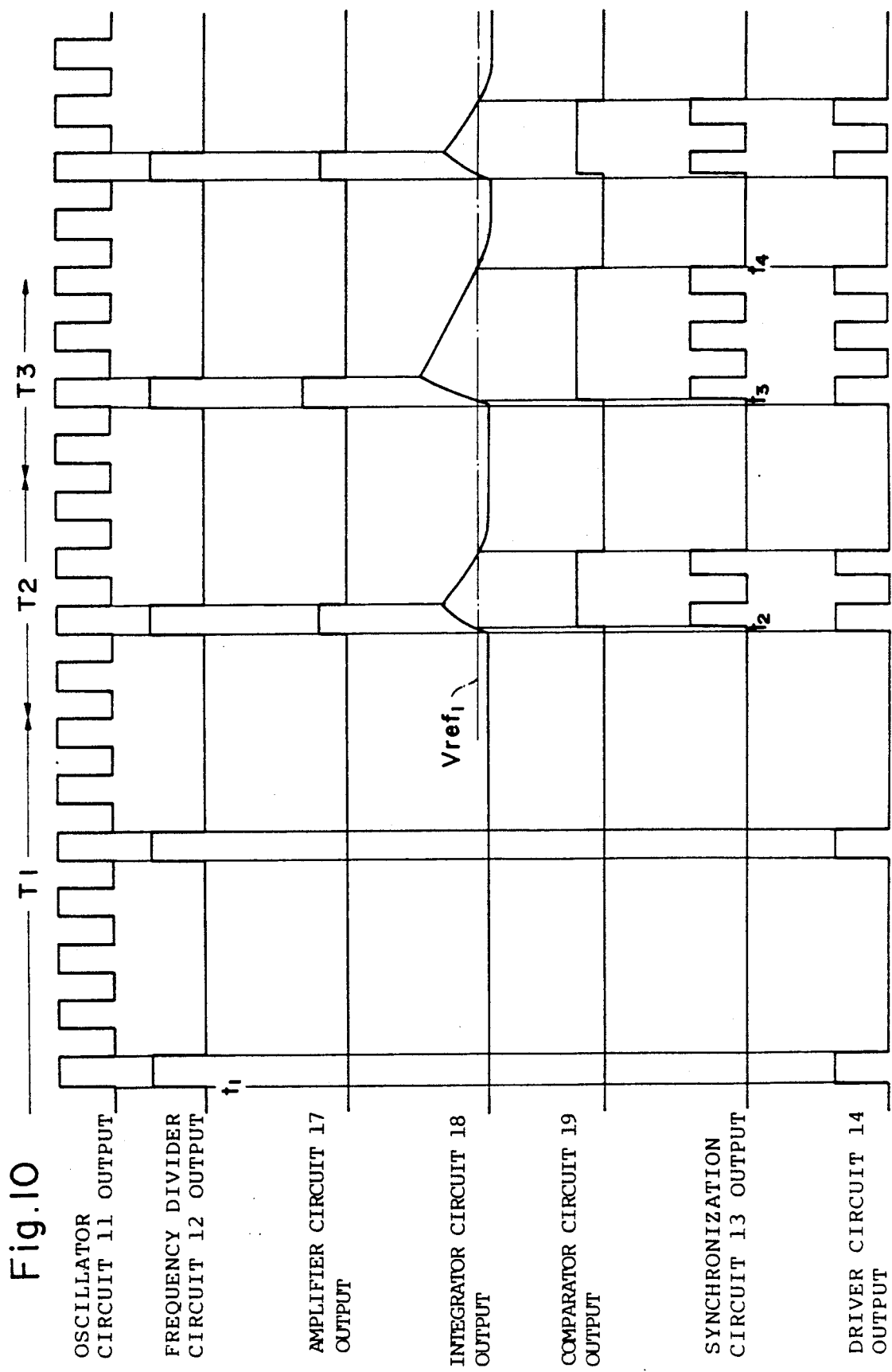
FIG. 10 is a timing chart showing operations of the switch of FIG. 9.
Figure 11A:
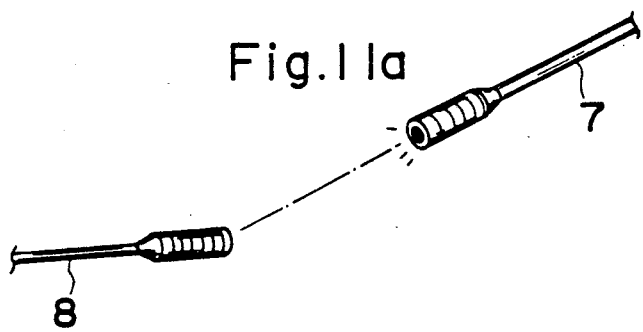
FIGS. 11a to 11c are diagrams showing alignment states of optical axes at the ends respectively of the light receiving and projecting optical fibers.

Next, a description will be given of operations of this embodiment. Referring now to FIG. 10, the frequency of the oscillation output from the oscillator, circuit 11 is divided by the frequency divider circuit 12 by four. Based on a logical sum computed between the frequency divided output and the output from the synchronization circuit 13 which will be described later, the driver circuit 14 drives the light projecting element 6. As shown in FIG. 11a, in a zone of time T1 in which the optical axis at the end portion of the light projecting optical fiber 7 is not aligned to that of the light receiving optical fiber 8, the light receiving element 9 is supplied with few output signals. In consequence, the output from the amplifier circuit 17 develops a value in the neighborhood of zero. The integrator circuit 18 therefore produces an output, which is below the threshold value Vref1 of the comparator circuit 17. Resultantly, the light projecting element 6 is driven for each predetermined period only by the output from the frequency divider circuit 12. Namely, in this state, the light is emitted at a low level for the operator adjusting the optical axes.

Figure 11B:
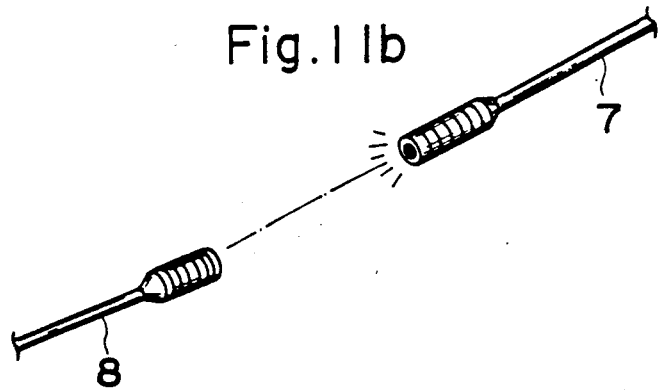

When an optical axis adjustment is conducted under this condition to substantially establish an alignment of the optical axes of the light projecting and receiving optical fibers 7 and 8 as shown in FIG. 11b, the output signal received from the light receiving element 9 is amplified through the amplifier circuit 15 and the synchronization circuit 16. This time zone is designated as T2 in FIG. 10 in which there is obtained from the amplifier circuit 17 an output amplified in association with the amount of the received light. The resultant signal is integrated through the integrator circuit 18. At a point of time $t_2$ when the integrated value exceeds the predetermined threshold value Vref1, the comparison output is produced. In consequence, the synchronization circuit 13 outputs a signal developed when the comparison output matches with the oscillation output so as to supply the signal to the driver circuit 14. As a result, the amount of light emitted for each unit of time is increased, which enables the operator to recognize that the end portion of the light projecting optical fiber 7 emits the light with a higher intensity. Consequently, comparing with the state of FIG. 11a in which the optical axes are not aligned to each other, the operator can gradually establish a complete alignment of the optical axes.

Figure 11C:
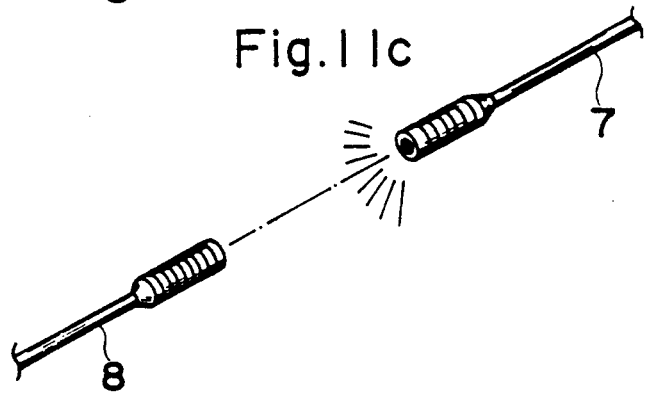

Furthermore, as can be seen from FIG. 11c, when the optical axes are finally aligned to each other (in a time zone T3), the amplifier circuit 17 generates an output at a higher level and hence the integration output becomes to be increased. In consequence, as indicated in the range between the points of time $t_3$ and $t_4$, the compartor circuit 19 produces an output with a wider signal width. In association therewith, the number of pulses of the oscillation output passing through the synchronization circuit 13 becomes to be greater. Resultantly, the number of driver pulses for each unit time is increased in the driver circuit 14. Namely, the operator adjusting the optical axes perceives the light having a higher intensity. As described above, the operator visually checks the intensity of light at the end portion of the light projecting optical fiber 7 to set the level of the amount of light to a higher level. Namely, without necessitating the confirmation of the state by means of the indicator lamp 110 or the like on the photoelectric switch, the optical axes can be appropriately adjusted only by use of the optical fiber portions. Although the embodiment employs the frequency divider 12 to divide the frequency of the original oscillation output by four, the division ratio or the divisor may be further increased so as to natually obtain a greater change in the amount of light emitted from the light projecting optical fiber 7 depending on the degree of the alignment between the optical fibers.

Figure 12:
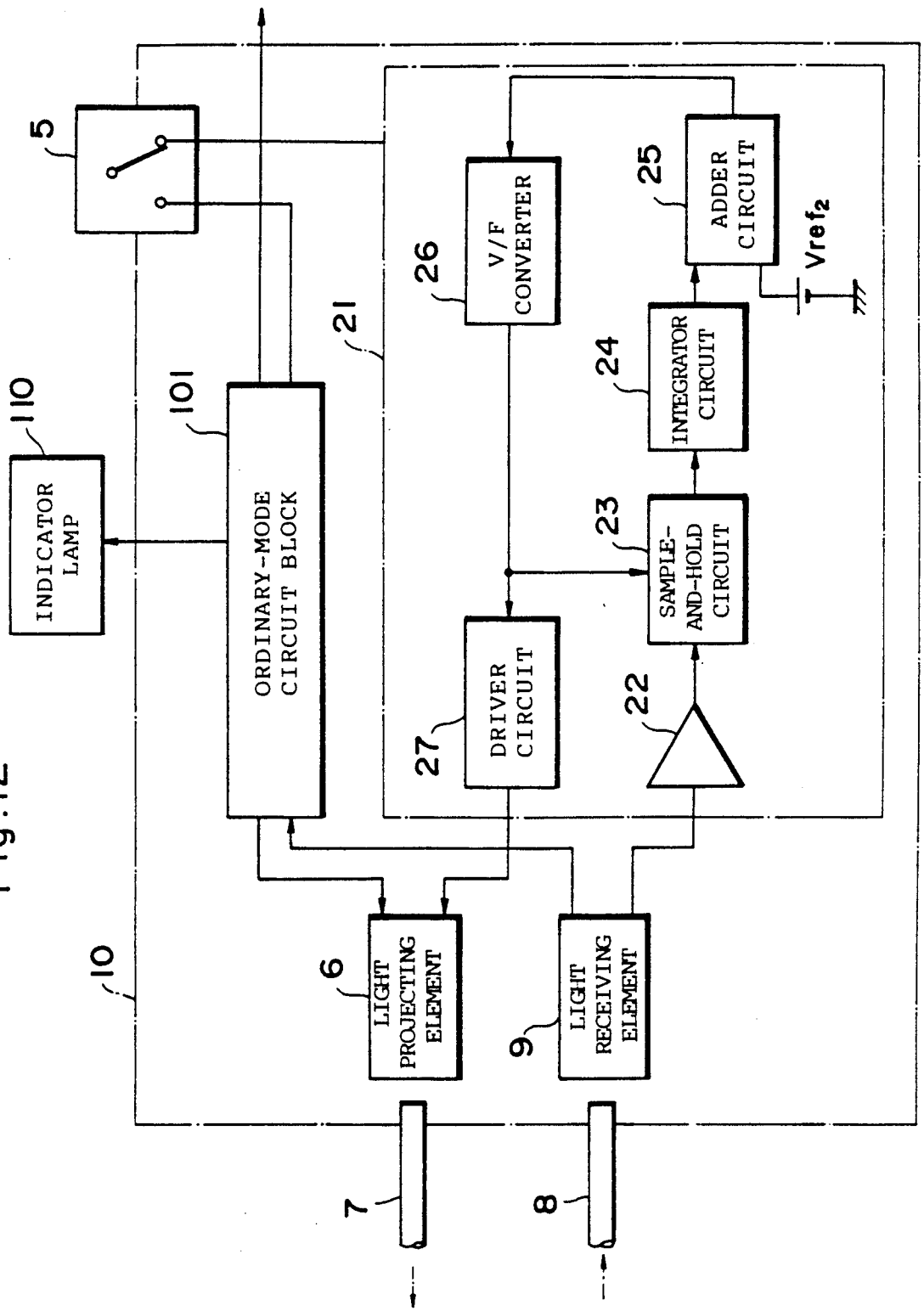
FIG. 12 is a block circuit diagram showing a photoelectric switch using optical fibers as a fifth embodiment in accordance with the present invention.

Next, a description will be given of the fifth embodiment in accordance with the present invention. This embodiment is characterized in that in place of the amount of light emitted from the light projecting optical fiber, the period of the light emission to be intermittently driven is changed. FIG. 12 is a block diagram showing the constitution of the embodiment. The same constituent components of this configuration as those of FIG. 9 are assigned with the same reference numerals. The system of FIG. 12 also includes an ordinary-mode circuit block 101 and an optical axis alignment circuit block 21, which are changed over by means of a mode change-over switch 5 so as to supply driver and receive signals associated with light projecting and receiving elements 6 and 9, respectively. The circuit block 21 includes an amplifier circuit 22 to amplify a receive signal attained from the light receiving element 9. The amplifier circuit 22 supplies an output to a sample-and-hold circuit 23. This circuit 23 samples and holds an amplified output at a timing which will be described later so as to supply an output to an integrator circuit 24. The integrator circuit 24 integrates a received signal to supply a resultant signal to an adder circuit 25. In the adder 25, a predetermined reference voltage Vref2 is added to the integrated output so as to feed the result of the addition to a voltage/frequency (V/F) converter 26. The converter 26 converts a supplied voltage to a low-frequency signal having a frequency repetition of which is visible and which is associated with the value of the input voltage. The converted signal is delivered to a driver circuit 27 and the sample-and-hold circuit 23. Based on the received output, the driver circuit 27 drives the light projecting element 6.

Figure 13:
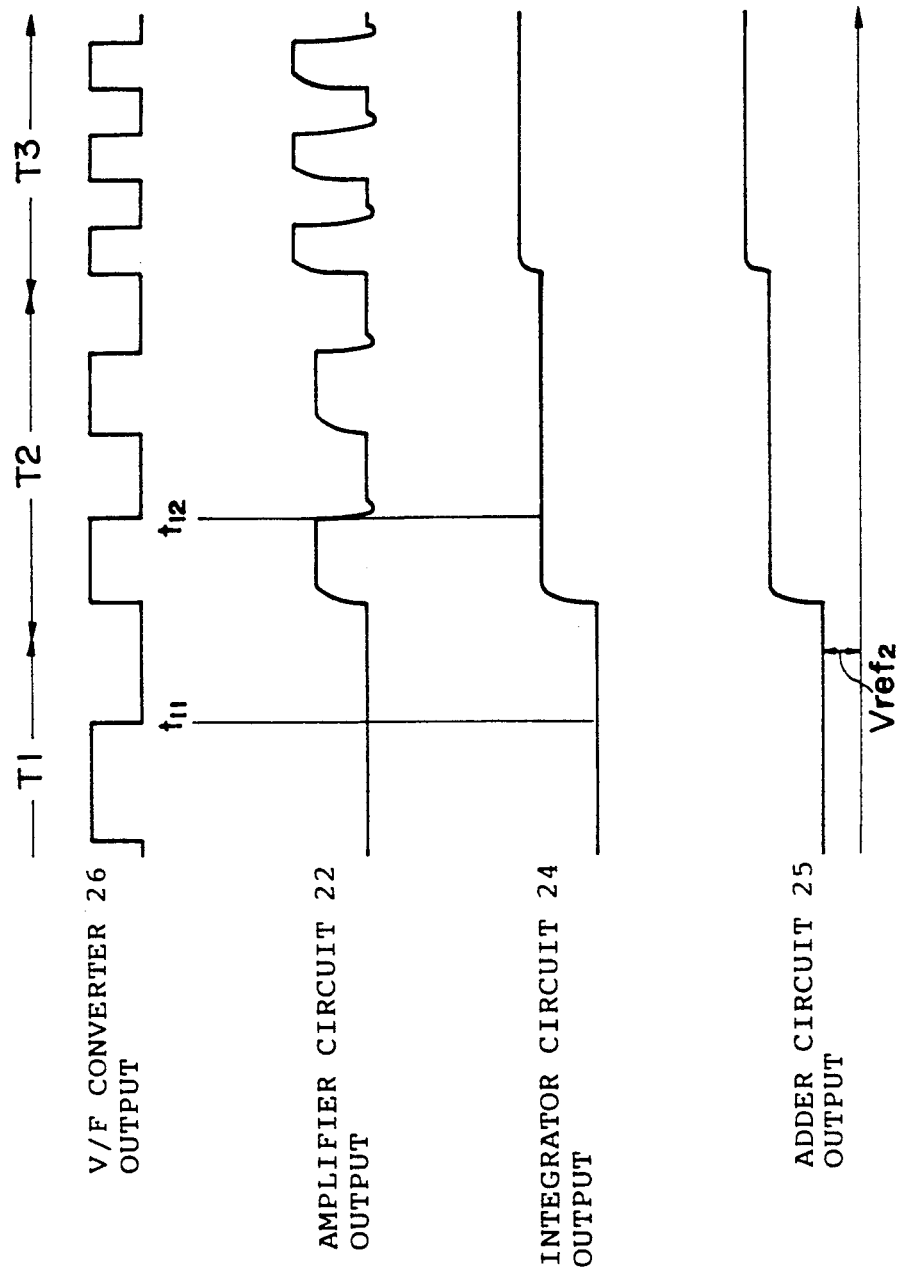
FIG. 13 is a timing chart showing operations of the switch of FIG. 12.

Referring next to timing charts of FIG. 13, a description will be given of operations of this embodiment. As shown in FIG. 11a, when the optical axes of the light projecting and receiving fibers are not aligned to each other, since the integrator circuit 24 does not receive any significant output, the V/F converter 26 directly receives the reference voltage Vref2 from the adder circuit 25. Resultantly, as indicated in a time zone T1 of FIG. 13, there is produced a low-frequency signal having a duty of, for example, 50%. The obtained signal is delivered via the driver circuit 27 to the light projecting element 6, which in turn emits lights. In a time zone T2 in which the optical axes are to be gradually aligned to each other, the light receiving element 9 obtains a light signal. The signal is passed via the amplifier circuit 22 to the sample-and-hold circuit 23. In consequence, at points of times $t_{11}$, $t_{12}$, etc., the output signal is held so as to be supplied to the integrator circuit 24. The integrator circuit 24 hence produces an output with an increased value. Namely, the V/F converter 26 generates a low-frequency signal having a frequency associated with a voltage obtained by adding the reference voltage Vref2 to the voltage outputted from the integrator circuit 24. This signal is delivered via the driver circuit 27 to the light projecting element 6, which is thereby driven to emit lights. Consequently, by visually checking the end portion of the light projecting optical fiber 7, the operator can recognize that the period of the driving operation is gradually reduced. In a state where the optical axes are aligned to each other as shown in FIG. 11c (time zone T3), the end portion of the light projecting optical fiber 7 blinks at a minimized period, thereby indicating that the axis alignment is completed. In accordance with the present invention, as described above, the axis alignment can be determined only by visually confirming the state of the end portions of the light projecting optical fiber 7.

Although the blinking frequency is increased as the axis alignment approaches the completed state in this embodiment, it may also be possible to lower the blinking frequency for this purpose.

In the respective embodiments above, the ordinary-mode circuit block and the optical axis alignment circuit block are disposed to be independent of each other; however, the circuit configuration can be naturally simplified by sharing such circuits as the oscillator circuit, the driver circuit, and the amplifier circuit.

While the particular embodiments of the invention have been shown and described, it will be obvious to those skilled in the art that various changes and modifications may be made without departing from the present invention in its broader aspects.

We claim:

1. A light projecting circuit of a photoelectric switch comprising:
   a light projecting element for emitting a visible light;
   a driver circuit for driving said light projecting element by use of pulse signals; and
   switch means, which is operated when an optical axis alignment of said photoelectric switch is performed, for increasing an amount of light emitted from said light projecting element.

2. A light projecting circuit in accordance with claim 1 wherein said switch means increases or decreases a pulse width of a pulse current flowing through said light projecting element.

3. A light projecting circuit in accordance with claim 1 wherein said switch means alters a pulse interval of a pulse current flowing through said light projecting element.

4. A light projecting circuit in accordance with claim 1 wherein said switch means selects an operation to superimpose a direct current onto a pulse current flowing through said light projecting element.

5. A light projecting circuit of a photoelectric switch comprising:
   a light projecting element for emitting a visible light;
   a transistor, controlled by pulse signals, for driving said light projecting element;
   a circuit, which is disconnected from said transistor in an operation mode of said photoelectric switch, for supplying a direct current to said light projecting element; and
   switch means, which is operated when an optical axis alignment of the photoelectric switch is performed, to connect said circuit to said transistor in parallel in response to the operation of said switch means.

6. A photoelectric switch employing optical fibers comprising:
   a light projecting element for emitting a visible light;
   a light receiving element for receiving said visible light emitted from said light projecting element;
   a light projecting optical fiber optically coupled with said light projecting element at one end thereof for introducing said visible light emitted from said light projecting element and for projecting said visible light at another end thereof;
   a light receiving optical fiber optically coupled with said light receiving element at one end thereof and arranged so as to receive said visible light projected from said another end of said light projecting optical fiber to lead said received visible light to said light receiving element
   first means for detecting an object depending on a level of light received by said light receiving element in an ordinary mode;
   second means, used in an optical axis alignment of said optical fibers, comprising,
   deciding means for determining an amount of light obtained from said light receiving optical fiber and received by said light receiving element for each first predetermined period; and
   light projecting means for varying a number of pulses emitted for each unit period of time from said light projecting element based on the amount of light thus determined by said deciding means.

7. A photoelectric switch employing optical fibers in accordance with claim 6 wherein:
   said decide means includes an integrator circuit for integrating a receive light signal attained by said light receiving element for each first predetermined period and a comparator circuit for comparing an output from said integrator circuit with a predetermined threshold value; and
   said light project means includes an oscillator circuit for oscillating a signal at a second predetermined period, a frequency divider circuit for dividing a frequency of an oscillation output from said oscillator circuit, a synchronization circuit for computing a logical product between an output from said comparator circuit of said decide means and the oscillation output from said oscillator circuit, and a driver circuit for driving said light projecting element by use of a logical sum obtained between an output from said synchronization circuit and an output from said frequency divider circuit.

8. A photoelectric switch employing optical fibers in accordance with claim 6 wherein said light project means includes:
   a voltage/frequency converter for converting a voltage designating the amount of light determined by said decide means into a low-frequency signal having a frequency associated with the voltage; and
   a driver circuit for driving said light projecting element based on an output from said voltage/frequency converter.

9. A photoelectric switch in accordance with claim 6 further comprising means for activating said second means when said optical axis alignment of said optical fibers is performed.

10. A method for projecting light in a light projecting circuit of a photoelectric switch comprising the steps of:
    emitting a visible light from a light projecting element;
    driving said light projecting element through a driver circuit by pulse signals; and
    increasing an amount of light emitted from said light projecting element by means of a switch in response to the performance of an optical axis alignment of said photoelectric switch.

11. The method according to claim 10, wherein said increasing step comprises increasing/decreasing a pulse width of a pulse current flowing through said light projecting element.

12. The method according to claim 10, wherein said increasing step further comprises altering a pulse interval of a pulse current flowing through said light projecting element by means of said switch.

13. The method according to claim 10, further comprising the step of selecting an operation to superimpose a direct current onto a pulse current flowing through said light projecting element.

14. A method for projecting light in a light projecting circuit having a light projecting element, a transistor controlled by pulse signals from said light projecting element, a circuit disconnected from said transistor during the operation of said electric switch, and a switch means operable when an optical axis alignment of said photoelectric switch is performed, comprising the steps of:
    emitting a visible light from said light projecting element;
    driving said light projecting element by said transistor controlled by said pulse signals;
    supplying a direct current to said light projecting element through said circuit, which is disconnected from said transistor in the operational mode; and
    connecting said circuit to said transistor in parallel by operation of said switch means when an optical alignment of said photoelectric switch is performed.

15. A method for aligning an optical axis of a photoelectric switch in a light projecting circuit, comprising the steps of:
    emitting a visible light from a light projecting element;
    receiving through a light receiving element, said visible light emitted from said light projecting element;
    introducing said visible light to a light projecting optical fiber at one end thereof;
    projecting said visible light at another end of said light projecting optical fiber;
    receiving said projected visible light from said light projecting optical fiber through a front end of a receiving optical fiber optically;
    feeding to said light receiving element said receiving light to an opposite end of said receiving optical fiber connected to said light receiving element;
    detecting an object depending on a level of light received by said light receiving element in an ordinary mode;
    determining an amount of light obtained from said light receiving optical fiber and received by said light receiving element for a first predetermined period; and
    varying a number of pulses produced for each unit element period of time from said light projecting element based on the amount of light determined in said determining step.

16. The method of claim 15, further comprising the steps of:
    integrating said received light signal obtained by said light receiving element for each first predetermined period;
    comparing an output from said integrator circuit with a predetermined threshold value;
    oscillating a signal at a second predetermined period, and providing a frequency of an oscillation output from said oscillator circuit;
    dividing a frequency of said output of said oscillation circuit;
    computing a logical synchronization project between an output provided from said comparison step and the output from said oscillation step; and
    driving said light projecting element by using a logical sum obtained from the output of said computing step and from said dividing step.

17. The method of claim 15 further comprising the steps of:
    converting, through a voltage frequency converter, a voltage designating the amount of light determined, in said integrating step, into a low frequency signal having a frequency associated with said voltage; and
    driving said light projecting element based on an output from said voltage/frequency converter.

* * * * *